United States Patent
Nuebling

(12) 
(10) Patent No.: US 12,149,206 B2
(45) Date of Patent: Nov. 19, 2024

(54) LOW CURRENT OSCILLATOR STRUCTURE WITH COMMON MODE TRANSIENT NOISE CANCELATION

(71) Applicant: Infineon Technologies AG, Neubiberg (DE)

(72) Inventor: Marcus Nuebling, Olching-Esting (DE)

(73) Assignee: Infineon Technologies AG, Neubiberg (DE)

( * ) Notice: Subject to any disclaimer, the term of this patent is extended or adjusted under 35 U.S.C. 154(b) by 344 days.

(21) Appl. No.: 17/808,279

(22) Filed: Jun. 22, 2022

(65) Prior Publication Data
US 2023/0421099 A1 Dec. 28, 2023

(51) Int. Cl.
*H03B 5/12* (2006.01)
*H04B 1/04* (2006.01)
*H04L 25/02* (2006.01)

(52) U.S. Cl.
CPC ......... *H03B 5/1212* (2013.01); *H04B 1/0475* (2013.01); *H04L 25/0266* (2013.01)

(58) Field of Classification Search
CPC .................................................. H03B 5/1212
See application file for complete search history.

(56) References Cited

U.S. PATENT DOCUMENTS

| | | | |
|---|---|---|---|
| 6,657,509 B1 * | 12/2003 | Ohannes | H03B 5/1215 331/177 V |
| 8,577,305 B1 * | 11/2013 | Rossi | H04B 7/0413 455/76 |
| 2001/0043124 A1 * | 11/2001 | Hilliard | G01R 27/2611 324/207.16 |
| 2006/0267646 A1 * | 11/2006 | Tan | H03L 7/0893 327/156 |

OTHER PUBLICATIONS

"RF detector basics", RF Wireless World, Retrieved from: https://www.rfwireless-world.com/Terminology/RF-detector.html, Accessed on Jun. 15, 2022, 4 pp.
Peters, "Techniques and Solutions for USB Power and Data Isolation", Digi-Key Electronics, Feb. 23, 2021, 9 pp.

* cited by examiner

*Primary Examiner* — Hsinchun Liao
(74) *Attorney, Agent, or Firm* — Shumaker & Sieffert, P.A.

(57) ABSTRACT

Circuitry to automatically compensate a differential output oscillator circuit for common mode disturbances that may affect the oscillator output. For any differential oscillator the common mode voltage excursion may reduce the oscillator output, which in some examples may negatively affect the circuitry receiving the oscillator output. The addition of feedback circuitry with an automatic gain control, e.g., to regulate the differential output voltage, may further reduce the gain of the oscillator in the presence of common mode voltage. In contrast, the feedback circuitry of the oscillator circuit of this disclosure may include gain control circuitry to increase an output voltage amplitude at the differential output terminals for a duration of the common mode disturbance.

20 Claims, 6 Drawing Sheets

LOW CURRENT OSCILLATOR STRUCTURE WITH COMMON MODE TRANSIENT NOISE CANCELATION

TECHNICAL FIELD

The disclosure relates to oscillator and amplifier circuitry.

BACKGROUND

For some applications, circuitry that includes an isolation barrier may be desirable, e.g., to protect against ground loops. In some examples without isolation, ground potential differentials may cause circuit damage, unexpected circuit behavior, or personal injury. Isolation barriers may prevent current flow or conduction between two or more separate electrical circuits but allow energy or data to pass between the two circuits. Some examples of isolation include galvanic isolation, capacitive isolation and similar isolation circuitry.

SUMMARY

In general, the disclosure describes circuitry with two or more automatic gain control circuits to sense a common mode noise or disturbance that may affect operation of the circuitry. In some applications, such as communications over an isolation barrier, a communication protocol, such as on-off keying (OOK), may use a radio frequency (RF) oscillator with or without an automatic gain control (AGC). In some examples, the ON portion of OOK may develop a higher current at the beginning of the on-time. For an OOK circuit with AGC, the common mode current during OOK data transmission may cause a common mode voltage excursion detected by the AGC. The common mode voltage excursion may reduce the oscillator output and can lead to the detection issues and inaccurate data transmission. For any differential oscillator, such as oscillator with a cross-coupled pair of transistors, the common mode voltage excursion may reduce the oscillator output enough to cause undesired behavior for the circuits receiving the output of the oscillator. The addition of an AGC to regulate the differential voltage may further reduce the gain of the oscillator in the presence of common mode voltage. For low current circuits, e.g., circuits in battery powered applications designed to minimize battery current and battery usage, the impact of common mode disturbances may have a greater impact, e.g., on data transmission reliability when compared with other applications that operate with higher electrical current.

In some examples, the circuit of this disclosure includes at least one common mode detector connected to the differential output of the oscillator. If the additional common mode detector senses noise at the output, the common mode detector may cause the AGC of the oscillator to apply more bias current to get a higher oscillation output amplitude for the duration of the sensed noise/disturbance.

In one example, this disclosure describes a device comprising an oscillator circuit including differential input terminals connected to the differential output terminals of the oscillator circuit; and in response to sensing a common mode disturbance at the differential output of the oscillator circuit, the common mode detector is configured to automatically control the gain to increase the output voltage amplitude at the differential output terminals for a duration of the common mode disturbance.

In another example, this disclosure describes a system comprising message output circuitry; message receiving circuitry; isolated data transmission circuitry configured to receive a control signal from the message output circuitry and transmit a message based on the control signal to the message receiving circuitry, the data transmission circuitry comprising an oscillator circuit including differential input terminals connected to the differential output terminals of the oscillator circuit; and in response to sensing a common mode disturbance at the differential output of the oscillator circuit, the common mode detector is configured to automatically control the gain to increase the output voltage amplitude at the differential output terminals for a duration of the common mode disturbance.

In another example, this disclosure describes a method of transmitting a message from message output circuitry over an isolation barrier to message receiving circuitry; the method comprising: receiving, by isolated data transmission circuitry, a control input from the message output circuitry, wherein the data transmission circuitry comprises an oscillator circuit and a feedback circuit, and wherein the feedback circuit comprises a common mode detector; controlling the oscillator circuit to turn off or to turn on based on the control input, wherein the oscillator circuit comprises differential output terminals; in response to sensing a common mode disturbance at the differential output of the oscillator circuit, increasing, by the common mode detector of the feedback circuit, an output voltage amplitude at the differential output terminals for a duration of the common mode disturbance.

The details of one or more examples of the disclosure are set forth in the accompanying drawings and the description below. Other features, objects, and advantages of the disclosure will be apparent from the description and drawings, and from the claims.

DETAILED DESCRIPTION

This disclosure describes circuitry to automatically compensate a differential output oscillator circuit for common mode disturbances that may affect the oscillator output. For any differential oscillator, such as oscillator with a cross-coupled pair of transistors, the common mode voltage excursion may reduce the oscillator output, which in some examples may negatively affect the circuitry connected to the oscillator output. The addition of feedback circuitry with an automatic gain control, e.g., to regulate the differential output voltage, may further reduce the gain of the oscillator in the presence of common mode voltage. In contrast, the feedback circuitry of the oscillator circuit of this disclosure may include gain control circuitry to increase an output voltage amplitude at the differential output terminals for a duration of the common mode disturbance.

An oscillator of this disclosure may be used in a variety of applications, such as communications over an isolation barrier, which may apply a communication protocol like such as on-off keying (OOK). In some examples, the ON portion of OOK may develop a higher current at the beginning of the on-time. For an OOK circuit with AGC, the common mode current during OOK data transmission over an isolation barrier may cause a common mode voltage excursion detected by the AGC. The common mode voltage excursion may reduce the oscillator output and can lead to the detection issues and inaccurate data transmission. However, the oscillator circuit of this disclosure may include a feedback circuit with at least one common mode detector connected to the differential output of the oscillator. If the common mode detector senses noise at the output, the common mode detector may cause the AGC of the oscillator to apply more bias current to get a higher differential oscillation output amplitude for the duration of the sensed noise/disturbance.

Figure 1:
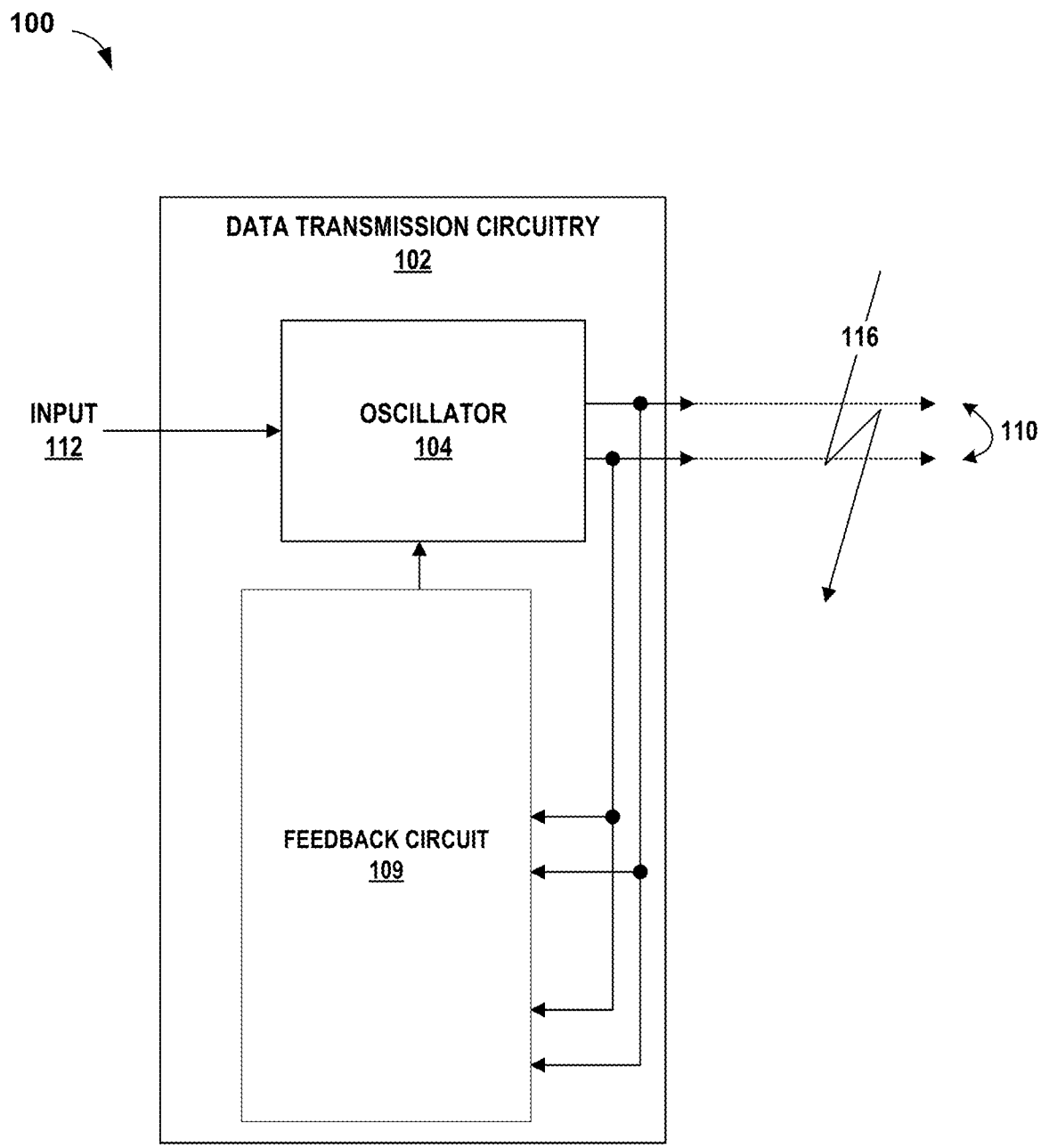
FIG. 1 is a block diagram illustrating a block diagram of an example oscillator circuit of this disclosure.

FIG. 1 is a block diagram illustrating a block diagram of an example oscillator circuit of this disclosure. For illustration purposes, system 100 depicts data transmission circuitry 102 that includes oscillator 104, which is an oscillator circuit with differential output terminals 110. However, the techniques of this disclosure may apply to any differential output oscillator in a variety of applications and operating at frequency ranges within the RF band or outside the RF band. Also, in the example of FIG. 1, feedback circuit 109 is shown as a separate block from oscillator 104 to simplify the explanation. In other examples, however, feedback circuit 109 may be included within an "oscillator circuit" of this disclosure. Oscillator 104 may be any type of differential oscillator circuit, such as an LC push-pull oscillator, an RC oscillator, a ring oscillator, a phase shift oscillator such as a Wien bridge oscillator, and other similar types of oscillator circuits.

Data transmission circuitry 102 may receive an input 112, e.g., to oscillator 104, which may come from some portion of a system, e.g., message output circuitry (not shown in FIG. 1) that may provide control signals to data transmission circuitry 102. The message output circuitry may include processing circuitry, such and an engine control unit or some similar system controller. In some examples, input 112 may be configured as an enable/disable signal for oscillator 104. In other examples, input 112 may conduct modulation signals to oscillator 104 to cause oscillator 104 to output communication signals from differential output terminals 110 based on a variety of modulation schemes. Some examples modulation schemes may include OOK, amplitude shift keying (ASK), frequency shift keying (FSK) or some other modulation scheme.

Differential output terminals 110 may be subject to a common mode disturbance 116, which may affect the performance of oscillator 104. In the example of an integrated circuit (IC), differential output terminals 110 may supply circuits on the IC or may supply off-chip circuits. Feedback circuit 109 may include differential input terminals connected to differential output terminals 110 of oscillator 104. Feedback circuit 109 may include a common mode detector configured to automatically control a gain of oscillator circuit 104. In response to sensing common mode disturbance 116 at differential output 110 feedback circuit 109 may automatically control the gain of oscillator 104 to increase the output voltage amplitude at differential output terminals 110 for a duration of the common mode disturbance. In some examples, feedback circuit 109 may also include circuitry, connected to differential output terminals 110, to automatically regulate the differential voltage at differential output terminals 110. In some examples, feedback circuit 109 may automatically control the gain of oscillator circuit 104, based on a magnitude of differential voltage at the differential output terminals. Adjusting the gain may regulate the output voltage amplitude on differential output terminals 110 of oscillator circuit 104, e.g., to keep the output voltage amplitude within a desired voltage range.

Figure 2:
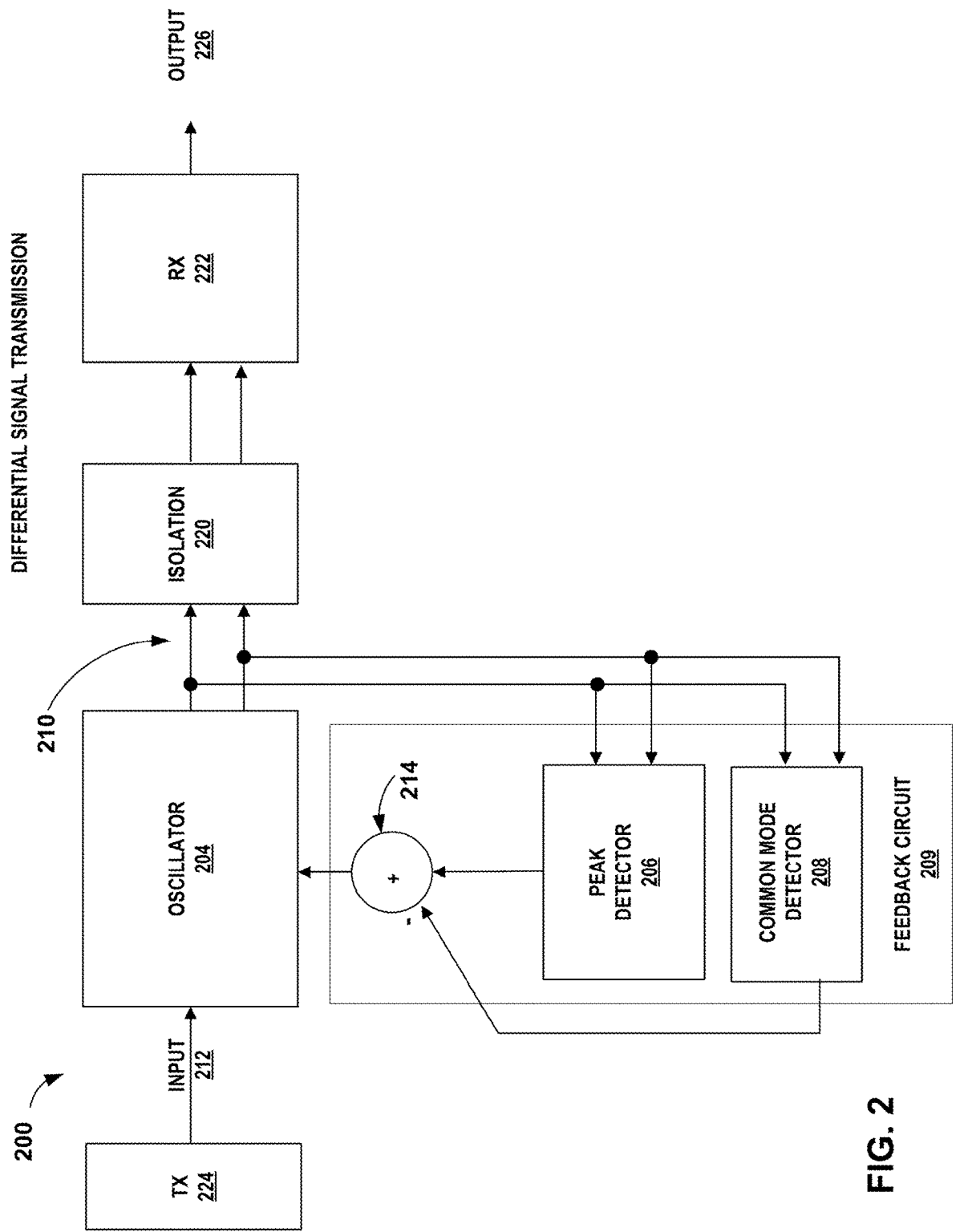
FIG. 2 is a block diagram illustrating a block diagram of a data transmission system with isolation circuitry.

FIG. 2 is a block diagram illustrating a block diagram of a data transmission system with isolation circuitry. System 200 includes oscillator 204 and feedback circuit 209, which are examples of oscillator 104 and feedback circuit 109 described above in relation to FIG. 1 and have the same or similar characteristics as described above. System 200 also includes message output circuitry, e.g., TX 224, isolation stage 220, and message receiving circuitry, Rx 222. The output 226 may provide configuration information, status, data, settings and similar electronic signals to other portions of system 200, e.g., a memory (not shown in FIG. 2). As noted above in relation to FIG. 1, system 200 illustrates a communication system, but oscillator 204, feedback circuit 209 and in some examples isolation stage 220 of this disclosure may be used in any number of other applications beyond just a communication system.

As with oscillator 104, oscillator 204 may be any type of differential output oscillator circuit. Feedback circuit 209 provides automatic gain control for oscillator 204. In the example of FIG. 2, feedback circuit 209 includes peak detector 206 and common mode detector 208.

Peak detector 206 is connected to differential outputs 210. Peak detector 206 may be configured to automatically control the gain of oscillator circuit 204 in order to regulate the output voltage amplitude on differential output terminals 210. In some examples, the output of peak detector 206 may control the gain to oscillator circuit 204 based on a magnitude of differential voltage at differential output terminals 210 to maintain the differential voltage within a desired range, as described above in relation to FIG. 1. In some examples, peak detector 206 may be implemented as an envelope detector.

Common mode detector 208 also includes differential input terminals connected to differential output terminals 210. Common mode detector 208 may be configured to automatically control the gain of oscillator 204 to increase the output voltage amplitude at differential output terminals 210 for a duration of a detected common mode disturbance. In the example of FIG. 2, the output of peak detector 206 and the output of common mode detector 208 sum together at 214 such that the output of common mode detector 208 may reduce the influence of peak detector 206 in response to sensing a common mode disturbance at differential output terminals 210.

Isolation stage 220 may be any type of isolation circuit, such as a galvanic isolation circuit. In this disclosure a galvanic isolation circuit may refer to capacitive isolation or electromagnetic isolation, such as a transformer, including a coreless transformer. Other types of isolation may include optical isolation. In the example of system 200, isolation stage 220 may conduct the output of oscillator 204 to message receiving circuitry RX 222. In other examples, isolation stage 220 may conduct the output of oscillator 204 to other types of components, as described above.

Figure 3:
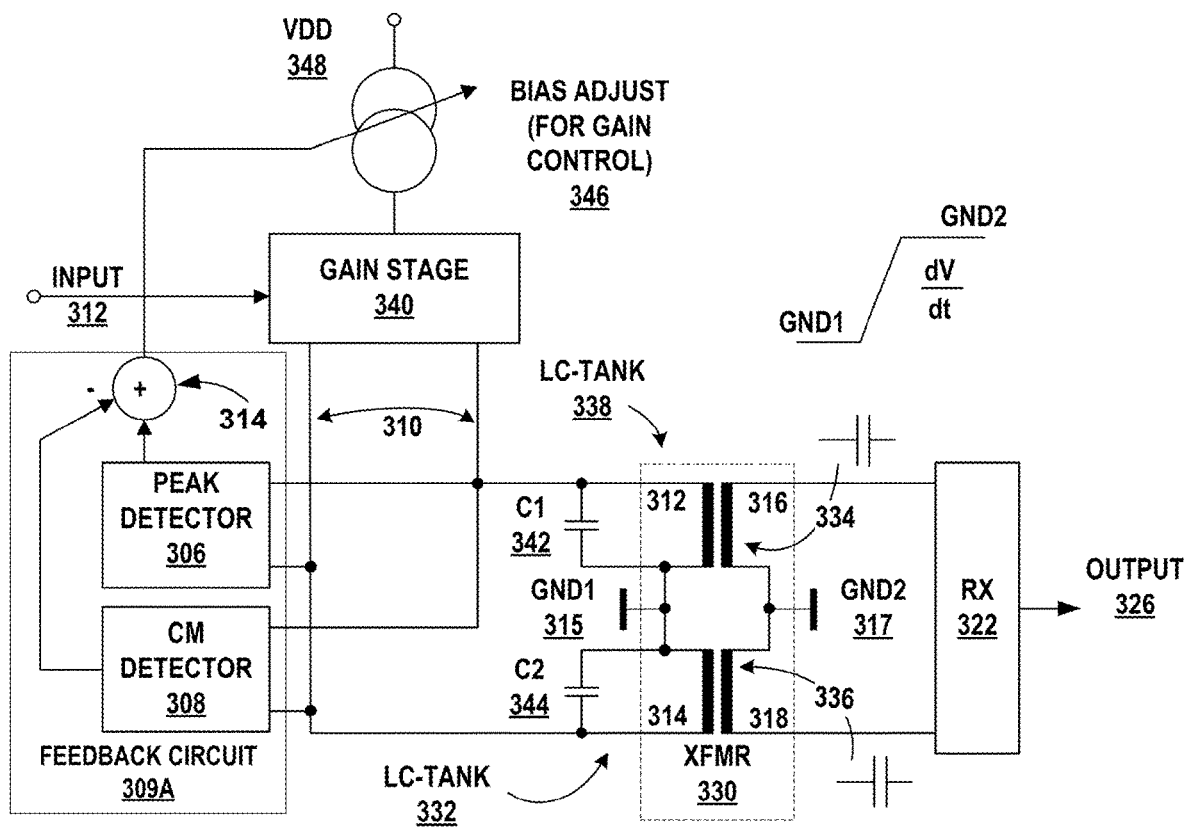
FIG. 3 is a block diagram illustrating a data transmission system with inductive isolation circuitry.

FIG. 3 is a block diagram illustrating a data transmission system with inductive isolation circuitry. The circuitry in FIG. 3 is an example implementations of systems 100 and 200 described above in relation to FIGS. 1 and 2. The example of FIG. 3 includes an oscillator circuit, gain stage 340 fed by a biasing circuit, bias adjust 346, and configured to receive input signals 312. Bias adjust 346 connects the power supply VDD 348 to gain stage 340.

The isolation stage of FIG. 3 includes capacitors C1 342, C2 344 and transformer 330. In some examples LC-tank 338 and LC-tank 332 of the isolation stage may be considered as included in the gain stage circuitry, e.g., in the example in which gain stage 340 is a LC push-pull oscillator. RX 322 may have the same or similar characteristics as described above for message receiving circuity, RX 222. Similarly feedback circuit 309A, which includes common mode detector 308 and peak detector 306 may have the same or similar characteristics as described above in relation to FIG. 2 for feedback circuit 209.

In the example of FIG. 3, differential output terminals 310 from gain stage 340 connect to peak detector 306 and common mode detector 308 of feedback circuit 309A, as described above in relation to FIGS. 1 and 2. Differential output terminals 310 also connect to the isolation stage. A first output terminal of differential output terminals 310 connects to primary terminal 312 for transformer 330. Capacitor C1 342 connects between the primary terminal 312 and center tap terminal 315, which connects to the primary side ground GND1. A second output terminal of differential output terminals 310 connects to primary terminal 314. Capacitor C2 344 connects between the primary terminal 314 and center tap terminal 315. Secondary terminals 316 and 318 connect to RX 322. Secondary center tap 317 connects to the secondary ground, GND2. The primary and secondary ground GND1 and GND2 are isolated from each other across transformer 330.

In the example of FIG. 3, transformer 330 is a differential transformer and in some examples may be a coreless transformer. Transformer 330 may also include parasitic capacitance between the primary and secondary side, e.g., parasitic capacitance 334 and 336. In some examples, LC-tank 338 may include capacitor C1 342, the inductance of transformer 330 between primary terminal 312 and secondary terminal 316 as well as parasitic capacitance 334. Similarly, in some examples, LC-tank 332 may include capacitor C2 344, the inductance of transformer 330 between primary terminal 314 and secondary terminal 318 as well as parasitic capacitance 336.

In the example in which gain stage 340 is a LC push-pull oscillator, the inductance of transformer 330 may be used as the LC tank for the oscillator, LC-tank 338 and LC-tank 332. As described above in relation to FIG. 1, in some examples, a common mode disturbance on differential output terminals 310 may negatively affect the performance of the circuit of FIG. 3. The circuit of FIG. 3 may act as a data transmission circuit to output data or commands to message receiving circuitry RX 322, e.g., by modulating the output of gain stage 340 based on signals received at input terminal 312, such as with OOK, ASK or some other modulation scheme.

Figure 4:
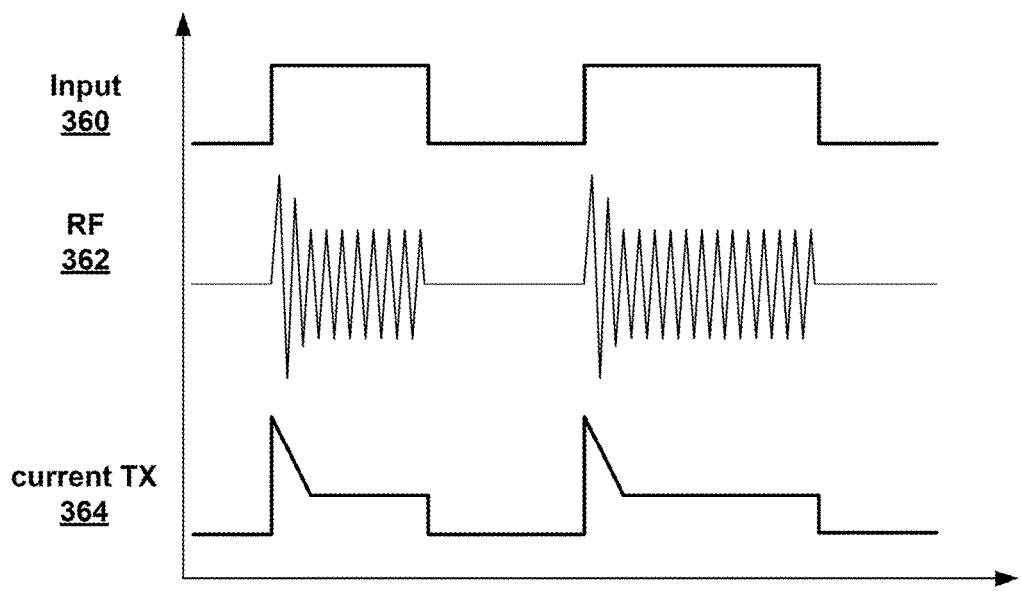
FIG. 4 is a timing diagram illustrating example signals during operation of an oscillator circuit subject to a common mode disturbance.
Figure 5:
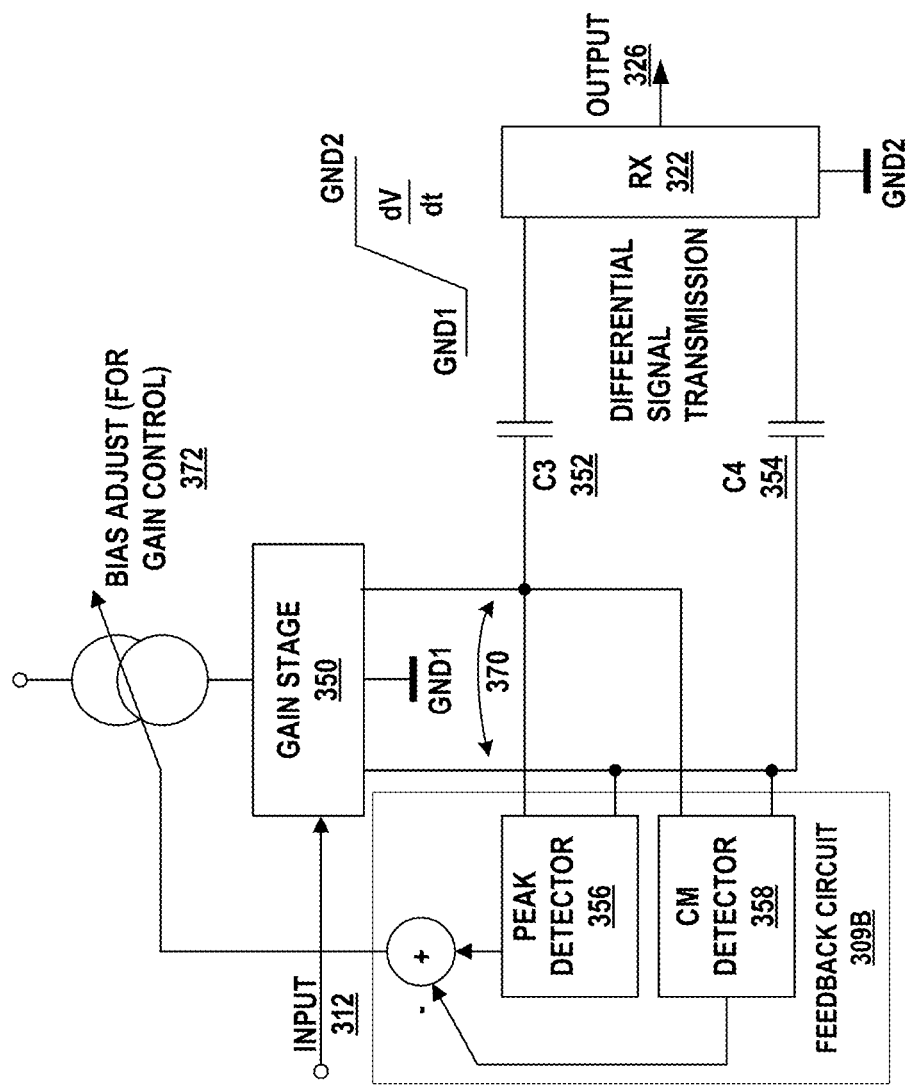
FIG. 5 is a block diagram illustrating a data transmission system with capacitive isolation circuitry.

As noted above, primary and secondary ground GND1 and GND2 are isolated from each other across transformer 330, and as shown in FIG. 3, in some examples, the circuit may have a difference in voltage between GND1 and GND2. The circuit arrangement of this disclosure, e.g., as depicted in FIGS. 1-4, may provide common mode transient immunity (CMTI), which may be desirable for circuits that handle different voltages between separate ground references, such as the communication circuit of FIGS. 3 and 5, isolated gate driver circuits and similar circuits. CMTI may be particularly desirable for circuits operating at higher slew rates, e.g., circuits in which the slew rate of switching waveform is faster than twenty volts per nanosecond (20V/ns), including circuits implemented with silicon carbide (SiC), gallium-nitride (GAN) and other types of materials.

The inherent parasitic capacitance 334 and 336 in transformer 330, when combined with a voltage difference between GND1 and GND2, along with fast switching speed that may be desirable for circuit efficiency may result in a dV/dt in the range of hundreds of volts per nanosecond (V/ns). For parasitic capacitance in the fempto-Farad range, the displacement currents may be on the order of milliamps (mA). Because the center taps 315 and 317 connect to ground the displacement current may flow to ground. However, the time constant for the transformer coils, L/R, means that the displacement current may flow for some time, but not to ground via the center tap. Instead, the displacement current may cause a common mode voltage spike to be superimposed on the modulated RF differential output 362, as shown in FIG. 4. For an OOK circuit with AGC, the common mode current during OOK data transmission over an isolation barrier may cause a common mode voltage excursion detected by the AGC, which may decrease the gain of the oscillator and decrease the differential output voltage.

As described above, in some example oscillator circuits, a common mode disturbance may cause the oscillator of gain stage 340 to decrease the output amplitude, and in some examples reduce the output enough to effectively pause the output for a period of time. Such gaps in an OOK transmission may result in the messages received by RX 322 that may be unreliable, or unreadable. In the example of a gain stage that includes automatic gain control, e.g., peak detector 306, which may provide a benefit of low current operation, the common mode disturbance at the output may trigger a response at peak detector 306 to control the gain at bias adjust 346 to decrease the output voltage amplitude further than for circuits without AGC. For circuits with lower electrical current consumption, which may be desirable for some applications, then the oscillator output may be even more sensitive to a CM disturbance.

Feedback circuit 309A of this disclosure may help overcome the issues caused by a CM disturbance. The combination of a regulating AGC circuit, such as peak detector 306, along with common mode detector 308 may provide both the desirable low current operation and reliable oscillator output by increasing the circuit gain at bias adjust 346 for the duration of the CM disturbance. As described above in relation to FIG. 2, the output of peak detector 306 and the output of common mode detector 308 sum together at 314 such that the output of common mode detector 308 may reduce the influence of peak detector 306 in response to sensing a common mode disturbance at differential output terminals 310.

FIG. 5 is a block diagram illustrating a data transmission system with capacitive isolation circuitry. The techniques of this disclosure described above in relation to FIGS. 1-4 may also apply to a circuit with a capacitor based isolation stage as shown in FIG. 5.

The example of FIG. 5 includes an oscillator circuit, gain stage 350 fed by a biasing circuit, bias adjust 372, and configured to receive input signals 312. In contrast to the transformer of FIG. 3, the isolation stage includes capacitors C3 352 and C4 354 that connect to RX 322 and isolate GND1 from GND2. RX 322 may have the same or similar characteristics as described above for message receiving circuitry, RX 222. Similarly, feedback circuit 309B, which includes common mode detector 358 and peak detector 356 may have the same or similar characteristics as described above in relation to FIG. 2 for feedback circuit 209.

Differential output terminals 370 from gain stage 350 connect to peak detector 356 and common mode detector 358 of feedback circuit 309B, as described above in relation to FIGS. 1 and 2. Differential output terminals 310 also connect to the isolation stage. The circuit arrangement for common mode detector 358 and peak detector 356 for a capacitive isolation architecture may be different than for common mode detector 308 and peak detector 306 as used for the isolation stage with an electromagnetic transformer architecture.

Figure 6:
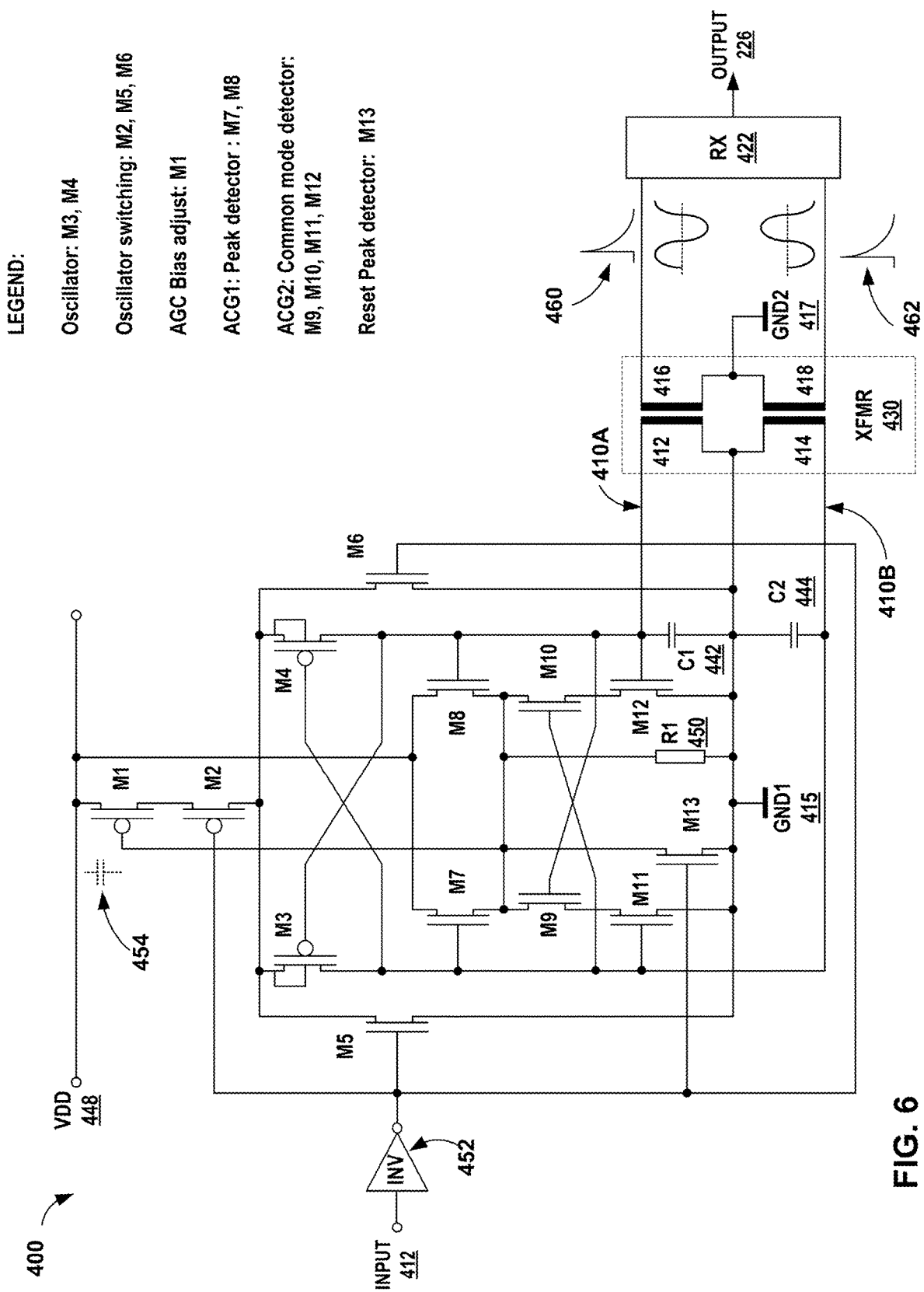
FIG. 6 is a schematic diagram illustrating a data transmission system with galvanic isolation circuitry according to one or more techniques of this disclosure.

FIG. 6 is a schematic diagram illustrating a data transmission system with galvanic isolation circuitry according to one or more techniques of this disclosure. System 400 is an example of systems 100 and 200 described above in relation to FIGS. 1 and 2, as well as an example of the circuit depicted in FIG. 3. As described above in relation to FIG. 1, the circuitry of FIG. 6 may also be described as data transmission circuitry configured to receive a control signal from message output circuitry via input terminal 412, and transmit a message based on the control signal to message receiving circuitry, RX 422. However, the oscillator circuit arrangement of FIG. 6 may be used for other applications beyond data transmission.

The example of FIG. 6 includes an LC push-pull oscillator circuit with cross-coupled P-channel transistors M3 and M4. The biasing circuit is P-channel transistor M1, which connects the oscillator to power supply VDD 448. As with any transistor, M1 may have some parasitic capacitance, indicated by capacitor 454.

The isolation stage includes capacitors C1 442, C2 444 and transformer 430. Similar to that described above in relation to FIG. 3A, in the example of FIG. 6, the inductance of transformer 430, along with C1 442 and C2 444, and in some examples parasitic capacitance of transformer 430 may form part of the LC tank for the oscillator. Transformer 430 isolates the primary ground GND1 and secondary ground GND2, and the circuit of FIG. 6 may have a voltage difference between GND1 and GND2.

In the example show in FIG. 6, differential output terminals 410A and 410B from the gain stage connect to the isolation stage. Output terminal 410A connects to primary terminal 412 for transformer 430. Capacitor C1 442 connects between the primary terminal 412 and center tap terminal 415, which connects to the primary side ground GND1. Output terminal 410B connects to primary terminal 414. Capacitor C2 444 connects between the primary terminal 414 and primary side center tap terminal 415. Secondary center tap 417 connects to the secondary ground, GND2. Secondary terminals 416 and 418 connect to RX 422. RX 422 connects to transformer 430 and may have the same or similar characteristics as described above for message receiving circuitry, RX 222.

Input 412 may receive control signals, e.g., from message output circuitry (e.g., TX 224 of FIG. 2, but not shown in FIG. 6). In the example of FIG. 6, the input signal is buffered and inverted by inverter 452. The output of inverter 452 connects to the gates of p-channel transistor M2 and n-channel transistors M5 and M6. Transistors M2, M5 and M6 form the oscillator switching circuit. In some examples, transistor M2 may be considered an enable switch, which turns the oscillator on or off.

In the example of FIG. 6, the drain-source channel (D-S channel) of M2 is in series with the D-S channel of M1 to connect VDD 448 to the cross coupled transistors M3 and M4 that are part of the oscillator. The gate of transistor M3 connects to the drain of transistor M4 and the gate of transistor M4 connects to the drain of transistor M3. The source of M3 is also output terminal 410B and the source of M4 is output terminal 410A.

The feedback circuitry for system 400 includes a peak detector to regulate the differential output voltage amplitude on differential output terminals 410A and 410B. The peak detector includes n-channel transistors M7 and M8 and the gates of M7 and M8 are the input terminals for the peak detector. The gate of M7 connects to output terminal 410B and the gate of M8 connects to output terminal 410A. The D-S channels for M7 and M8 connect in parallel between power supply VDD 448, then through resistor R1 450 to GND1 and center tap terminal 415. N-channel transistor M13 also connects the D-S channels of M7 and M8 to GND1 in parallel with resistor R1 450. When activated, transistor M13 may short across R1 450 to reset the peak detector. The peak detector including M7, M8 and R1 450 may also be considered an envelope detector.

Similar to that described above in relation to FIGS. 1-5, in system 400 of FIG. 6, a common mode disturbance, e.g., 460 and 462, on differential output terminals 410A and 410B may be superimposed on the output differential signal. In some examples, the peak detector of system 400 may not distinguish between a voltage excursion at the output that needs regulation and a voltage excursion caused by the common mode disturbance. As a result the peak detector may regulate the gate voltage of M1, which changes the bias current to the oscillator and may decrease the output differential voltage magnitude. However, even for an oscillator circuit without the peak detector of M7 and M8, a common mode disturbance at the output terminals may decrease the gate-source voltage on both M3 and M4 and decrease the gain. The peak detector may provide the benefit of regulating the oscillator output current to provide the advantages of a low current circuit, but may exacerbate the impact of a common mode disturbance.

Similar to that described above in relation to FIGS. 1, 2 and 3, system 400 of FIG. 6 includes a common mode detector, which includes n-channel transistors M9, M10, M11 and M12. M9 and M10 are cross-coupled transistors with the gate of M9 connected to the output terminal 410A and the gate of M10 connected to output terminal 410B. The gate of transistor M11 connects to output terminal 410B and the gate of M12 connects to output terminal 410A.

The D-S channels of M9 and M11 are connected in series with each other and with the D-S channel of M7. Similarly, the D-S channels of M10 and M12 are connected in series with each other and with the D-S channel of M8. Transistors M9 and M11 together connect the gate of bias transistor M1 to GND1 and similarly, M10 and M12 connect the gate of M1 to GND1. In the presence of a common mode disturbance superimposed on the output differential signal, the arrangement of M9, M11, M10 and M12 pull the voltage on the gate of M1 toward GND1, which may reduce influence of the peak detector from decreasing the bias through M1 and therefore decreasing the differential output voltage. In other words, for a common mode disturbance, the common mode detector circuitry may override the AGC function of the peak detector circuit of M7, M8 and R1 450 on the bias generation for the gain stage. However, in the presence of a differential voltage, at least one transistor in the path to ground, e.g., at least one of M9 or M11 and at least one of M10 or M12, may be non-conducting and therefore the common mode detector circuit may have no impact on bias transistor M1 and on the electrical supply current to the gain stage for a differential voltage excursion. The common mode detector circuitry may also be considered a common mode peak detector.

As described above, the architecture of system 400 is just one example implementation of the techniques of this disclosure. The circuit of FIG. 6 may have advantages of low current consumption, few components and simple arrangement to provide a stable differential output, when compared to other implementations. A simple implementation may be desirable for circuits operating at higher frequencies, e.g., in the RF GHz range. Other implementations, e.g., with more transistors, may result in added poles and zeros, reduced bandwidth, and may not be able to operate efficiently at higher frequencies. Also, the arrangement of FIG. 6 may be desirable for circuits operating at higher voltages, e.g., power converters, motor drives and similar applications operating in the range of hundreds of volts. For higher voltage domains, common mode rejection may be a useful parameter, when compared to low voltage applications such as mobile devices that may be more concerned with reducing phase noise, jitter and other parameters. In other words, the robust common mode rejection features of the circuit arrangement of FIG. 6 may be desirable when transmitting data across domains with a high voltage difference between the domains and for applications in which reduced current consumption is desirable, e.g., battery powered vehicles and similar applications.

In other examples the oscillator gain stage, e.g., oscillator 104 and 204 of FIGS. 1 and 2, may be implemented with metal oxide semiconductor transistors (MOSFET) as shown in FIG. 6, or with tubes, bipolar junction transistors (BJT) or other switching components. The example of FIG. 6 may be implemented with a variety of technologies, including for example SiC and GaN.

Figure 7:
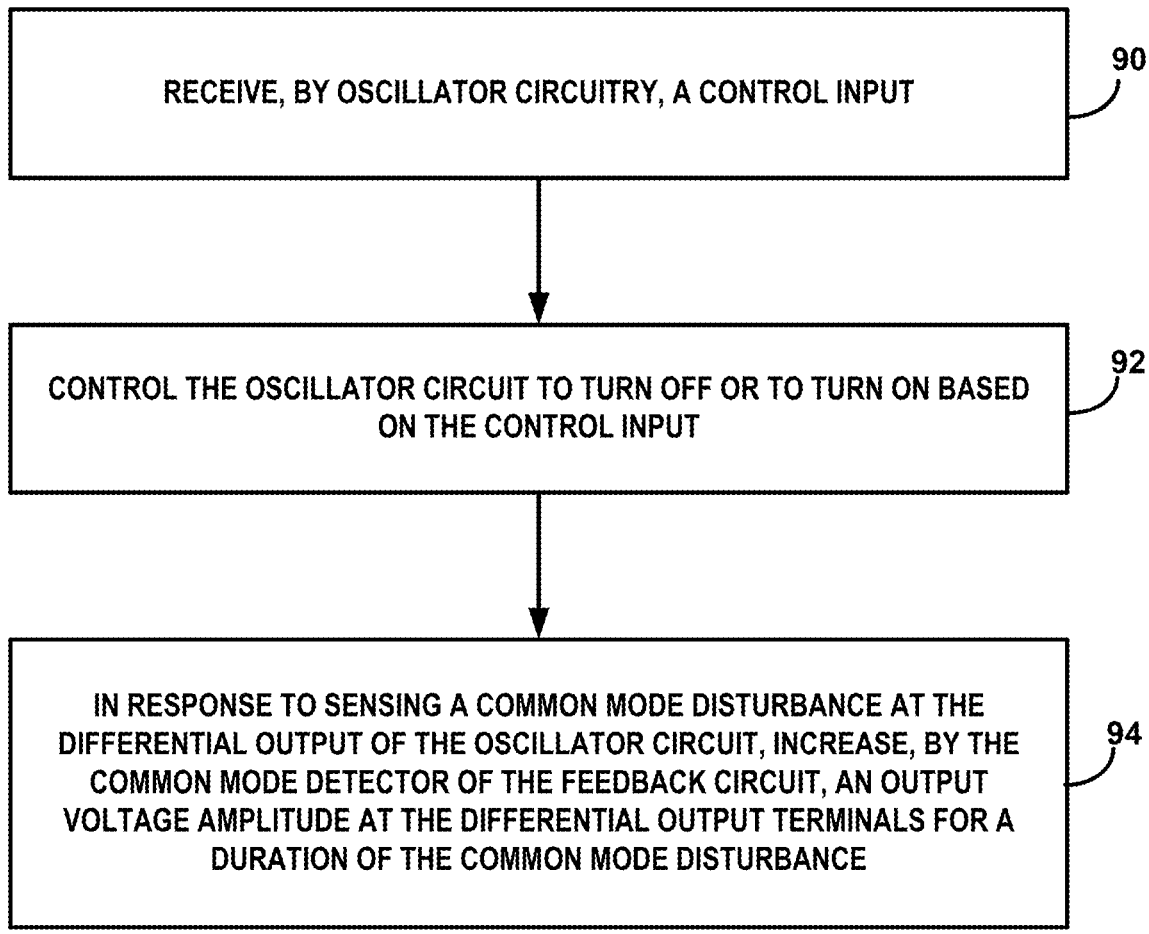
FIG. 7 is a flow chart illustrating an example operation of the differential data transmission system of this disclosure.

FIG. 7 is a flow chart illustrating an example operation of the differential data transmission system of this disclosure. The blocks of FIG. 7 will be described in terms of FIGS. 2 and 6, unless otherwise noted.

As seen in the example of FIG. 7, oscillator circuitry, such as oscillator 204 of FIG. 2, may receive a control signal at input terminal 212 (90). Similarly the LC push-pull oscillator of FIG. 6, which includes transistors M3 and M4 may receive a control signal at input terminal 412. In some examples, the control signal may come from processing circuitry, as described above in relation to FIG. 1. In some examples, the oscillator circuitry may be a part of data transmission circuitry and the received control signal may modulate the output of the oscillator circuitry to carry a message, which may include data, commands, status and other information.

The received control signal may cause the oscillator circuitry to turn off or to turn on based on the control signal at the input terminal (92). In some examples the control signal may be an enable signal, e.g., may control an enable switch such as transistor M2 of FIG. 6 to control the supply current to the oscillator. In some examples, turning on and off the oscillator, or controlling the oscillator output, may be a modulation scheme such as OOK, as described above.

The system of this disclosure may include a feedback circuit with a common mode detector, configured to provide AGC in response to sensing a common mode disturbance at the differential output of the oscillator circuit. For example, as described above in relation to FIG. 6, transistors M9, M11, M10 and M2 may increase an output voltage amplitude at differential output terminals 410A and 410B for a duration of the common mode disturbance (94), e.g., by controlling the voltage on the gate of bias transistor M1.

The techniques of this disclosure may also be described in the following clauses.

Clause 1: A device comprising: an oscillator circuit including differential input terminals connected to the differential output terminals of the oscillator circuit; and in response to sensing a common mode disturbance at the differential output of the oscillator circuit, the common mode detector is configured to automatically control the gain to increase the output voltage amplitude at the differential output terminals for a duration of the common mode disturbance.

Clause 2: The device of clause 1, wherein the feedback circuit further comprises a peak detector, wherein the peak detector is: connected to the differential output of the oscillator circuit, configured to automatically control the gain of the oscillator circuit in order to regulate the output voltage amplitude on the differential output terminals of the oscillator circuit based on a magnitude of differential voltage at the differential output terminals.

Clause 3: The device of any of clauses 1 and 2, further comprising an isolation barrier connected to the differential output terminals, wherein the isolation barrier comprises galvanic isolation circuitry.

Clause 4: The device of clause 3, wherein the device is configured to transmit messages across the isolation barrier using on-off keying (OOK).

Clause 5: The device of any of clauses 1 through 4, wherein the oscillator circuit operates at radio frequency (RF), and wherein the oscillator circuit comprises at least one of: a push pull LC oscillator circuit, a ring oscillator circuit, and a Wien bridge oscillator.

Clause 6: The device of any of clauses 1 through 5, further comprising a bias adjustment for gain control, wherein the oscillator circuit comprises a gain stage, wherein the bias adjustment controls an electrical current to the gain stage, and wherein the feedback circuit is configured to control the bias adjustment to regulate the output voltage amplitude.

Clause 7: The device of clause 6, wherein the gain stage comprises a first pair of cross-coupled switches, and wherein the common mode detector comprises at least a second pair of cross-coupled switches, configured to: control the bias adjustment to increase the electrical current to the gain stage for a common mode disturbance at the differential output of the oscillator circuit; and have no impact on the electrical current to the gain stage for a differential mode excursion at the gain stage.

Clause 8: The device of any of clauses 6 and 7, wherein the isolation stage comprises coil with a center tap, and wherein the center the center tap is configured to conduct displacement current to a ground terminal.

Clause 9: A system comprising message output circuitry; message receiving circuitry; isolated data transmission circuitry configured to receive a control signal from the message output circuitry and transmit a message based on the control signal to the message receiving circuitry, the data transmission circuitry comprising an oscillator circuit including differential input terminals connected to the differential output terminals of the oscillator circuit; and in response to sensing a common mode disturbance at the differential output of the oscillator circuit, the common mode detector is configured to automatically control the gain to increase the output voltage amplitude at the differential output terminals for a duration of the common mode disturbance.

Clause 10: The system of clause 9 further comprising an isolation barrier connected to the differential output terminals, wherein the isolation barrier comprises galvanic isolation circuitry.

Clause 11: The system of any of clauses 9 and 10, wherein the feedback circuit further comprises a peak detector, wherein the peak detector is: connected to the differential output of the oscillator circuit, configured to automatically control the gain of the oscillator circuit in order to regulate the output voltage amplitude on the differential output terminals of the oscillator circuit based on a magnitude of differential voltage at the differential output terminals.

Clause 12: The system of any of clauses 10 and 11, wherein the oscillator circuit operates at radio frequency (RF), and wherein the oscillator circuit comprises at least one of: a push pull LC oscillator circuit, a ring oscillator circuit, and a Wien bridge oscillator.

Clause 13: The system of any of clauses 9 through 12, further comprising a bias adjustment for gain control, wherein the oscillator circuit comprises a gain stage, wherein the bias adjustment controls an electrical current to the gain stage, and wherein to regulate the output voltage amplitude the feedback circuit is arranged to control the bias adjustment.

Clause 14: The system of clause 13, wherein the gain stage comprises a first pair of cross-coupled switches, and wherein the common mode detector comprises at least a second pair of cross-coupled switches, configured to: control the bias adjustment to increase the electrical current to the gain stage for a common mode disturbance at the differential output of the oscillator circuit; and have no impact on the electrical current to the gain stage for a differential mode excursion at the gain stage.

Clause 15: The system of any of clauses 13 and 14, further comprising coil with a center tap, wherein the center the center tap is configured to conduct displacement current to a ground terminal.

Clause 16: A method of transmitting a message from message output circuitry over an isolation barrier to message receiving circuitry; the method comprising: receiving, by isolated data transmission circuitry, a control input from the message output circuitry, wherein the data transmission circuitry comprises an oscillator circuit and a feedback circuit, and wherein the feedback circuit comprises a common mode detector; controlling the oscillator circuit to turn off or to turn on based on the control input, wherein the oscillator circuit comprises differential output terminals; in response to sensing a common mode disturbance at the differential output of the oscillator circuit, increasing, by the common mode detector of the feedback circuit, an output voltage amplitude at the differential output terminals for a duration of the common mode disturbance.

17. The method of clause 16, wherein the feedback circuit further comprises a peak detector connected to the differential output terminals, the method further comprising, regulating, by the peak detector, the output voltage amplitude on the differential output terminals from the oscillator circuit, based on a magnitude of differential voltage at the differential output terminals.

Clause 18: The method of clauses 16 and 17, wherein the oscillator circuit comprises a gain stage, wherein regulating the voltage amplitude on the differential output terminals comprises controlling an electrical current to the gain stage, wherein controlling the electrical current comprises controlling a bias adjustment for the gain stage.

Clause 19: The method of any of clauses 16 through 18, wherein the gain stage comprises a first pair of cross-coupled switches, and wherein the common mode detector comprises at least a second pair of cross-coupled switches, configured to: control the bias adjustment to increase the electrical current to the gain stage for a common mode disturbance at the differential output of the oscillator circuit; and have no impact on the electrical current to the gain stage for a differential mode excursion at the gain stage.

Clause 20: The method of any of clauses 16 through 18, wherein the isolation barrier comprises galvanic isolation circuitry, and wherein controlling the oscillator circuit to turn off or to turn on based on the control input comprises controlling the data transmission circuity to transmit the message across the isolation barrier using on-off keying (OOK).

In one or more examples, the functions described above may be implemented in hardware, software, firmware, or any combination thereof. For example, the various components of FIGS. 1-2 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the term "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described.

The term "non-transitory" may indicate that a storage medium, such as a memory, is not embodied in a carrier wave or a propagated signal. In certain examples, a non-transitory storage medium may store data that can, over time, change (e.g., in RAM or cache). By way of example, and not limitation, such computer-readable storage media, may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media.

Various examples of the disclosure have been described. These and other examples are within the scope of the following claims.

What is claimed is:

1. A device comprising:
   an oscillator circuit including differential output terminals;
   a feedback circuit comprising a common mode detector configured to automatically control a gain of the oscillator circuit, the common mode detector:

comprising differential input terminals connected to the differential output terminals of the oscillator circuit; and in response to sensing a common mode disturbance at the differential output of the oscillator circuit, the common mode detector is configured to automatically control the gain to increase an output voltage amplitude at the differential output terminals for a duration of the common mode disturbance.

2. The device of claim 1, wherein the feedback circuit further comprises a peak detector, wherein the peak detector is:
    connected to the differential output of the oscillator circuit, and
    configured to automatically control the gain of the oscillator circuit in order to regulate the output voltage amplitude on the differential output terminals of the oscillator circuit based on a magnitude of differential voltage at the differential output terminals.

3. The device of claim 1, further comprising an isolation barrier connected to the differential output terminals, wherein the isolation barrier comprises galvanic isolation circuitry.

4. The device of claim 3, wherein the device is configured to transmit messages across the isolation barrier using on-off keying (OOK).

5. The device of claim 1,
    wherein the oscillator circuit operates at radio frequency (RF), and
    wherein the oscillator circuit comprises at least one of: a push pull LC oscillator circuit, a ring oscillator circuit, and a Wien bridge oscillator.

6. The device of claim 1, further comprising a bias adjustment for gain control,
    wherein the oscillator circuit comprises a gain stage,
    wherein the bias adjustment controls an electrical current to the gain stage, and
    wherein the feedback circuit is configured to control the bias adjustment to regulate the output voltage amplitude.

7. The device of claim 6,
    wherein the gain stage comprises a first pair of cross-coupled switches, and
    wherein the common mode detector comprises at least a second pair of cross-coupled switches, configured to:
        control the bias adjustment to increase the electrical current to the gain stage for the common mode disturbance at the differential output of the oscillator circuit; and
        have no impact on the electrical current to the gain stage for a differential mode excursion at the gain stage.

8. The device of claim 6,
    wherein the isolation stage comprises coil with a center tap, and
    wherein the center tap is configured to conduct displacement current to a ground terminal.

9. A system comprising:
    message output circuitry;
    message receiving circuitry;
    isolated data transmission circuitry configured to receive a control signal from the message output circuitry and transmit a message based on the control signal to the message receiving circuitry, the data transmission circuitry comprising:
        an oscillator circuit comprising differential output terminals;
        a feedback circuit comprising a common mode detector configured to automatically control a gain of the oscillator circuit, the common mode detector:
            comprising differential input terminals connected to the differential output terminals of the oscillator circuit; and
            in response to sensing a common mode disturbance at the differential output of the oscillator circuit, the common mode detector is configured to automatically control the gain to increase an output voltage amplitude at the differential output terminals for a duration of the common mode disturbance.

10. The system of claim 9 further comprising an isolation barrier connected to the differential output terminals, wherein the isolation barrier comprises galvanic isolation circuitry.

11. The system of claim 9, wherein the feedback circuit further comprises a peak detector, wherein the peak detector is:
    connected to the differential output of the oscillator circuit, and
    configured to automatically control the gain of the oscillator circuit in order to regulate the output voltage amplitude on the differential output terminals of the oscillator circuit based on a magnitude of differential voltage at the differential output terminals.

12. The system of claim 10,
    wherein the oscillator circuit operates at radio frequency (RF), and
    wherein the oscillator circuit comprises at least one of: a push pull LC oscillator circuit, a ring oscillator circuit, and a Wien bridge oscillator.

13. The system of claim 9, further comprising a bias adjustment for gain control,
    wherein the oscillator circuit comprises a gain stage,
    wherein the bias adjustment controls an electrical current to the gain stage, and
    wherein to regulate the output voltage amplitude the feedback circuit is arranged to control the bias adjustment.

14. The system of claim 13,
    wherein the gain stage comprises a first pair of cross-coupled switches, and
    wherein the common mode detector comprises at least a second pair of cross-coupled switches, configured to:
        control the bias adjustment to increase the electrical current to the gain stage for the common mode disturbance at the differential output of the oscillator circuit; and
        have no impact on the electrical current to the gain stage for a differential mode excursion at the gain stage.

15. The system of claim 13, further comprising an isolation stage, the isolation stage comprising: coil with a center tap, wherein the center tap is configured to conduct displacement current to a ground terminal.

16. A method of transmitting a message from message output circuitry over an isolation barrier to message receiving circuitry; the method comprising:
    receiving, by isolated data transmission circuitry, a control input from the message output circuitry,
        wherein the data transmission circuitry comprises an oscillator circuit and a feedback circuit, and
        wherein the feedback circuit comprises a common mode detector;

controlling the oscillator circuit to turn off or to turn on based on the control input, wherein the oscillator circuit comprises differential output terminals; and in response to sensing a common mode disturbance at the differential output of the oscillator circuit, increasing, by the common mode detector of the feedback circuit, an output voltage amplitude at the differential output terminals for a duration of the common mode disturbance.

17. The method of claim 16, wherein the feedback circuit further comprises a peak detector connected to the differential output terminals, the method further comprising, regulating, by the peak detector, the output voltage amplitude on the differential output terminals from the oscillator circuit, based on a magnitude of differential voltage at the differential output terminals.

18. The method of claim 17, wherein the oscillator circuit comprises a gain stage, and wherein regulating the voltage amplitude on the differential output terminals comprises controlling an electrical current to the gain stage, wherein controlling the electrical current comprises controlling a bias adjustment for the gain stage.

19. The method of claim 18, wherein the gain stage comprises a first pair of cross-coupled switches, and wherein the common mode detector comprises at least a second pair of cross-coupled switches, configured to:

control the bias adjustment to increase the electrical current to the gain stage for a common mode disturbance at the differential output of the oscillator circuit; and have no impact on the electrical current to the gain stage for a differential mode excursion at the gain stage.

20. The method of claim 16, wherein the isolation barrier comprises galvanic isolation circuitry, and wherein controlling the oscillator circuit to turn off or to turn on based on the control input comprises controlling the data transmission circuity to transmit the message across the isolation barrier using on-off keying (OOK).

\* \* \* \* \*